US012067270B2

(12) United States Patent
Lu et al.

(10) Patent No.: US 12,067,270 B2
(45) Date of Patent: Aug. 20, 2024

(54) MEMORY DEVICE SECURITY AND ROW HAMMER MITIGATION

(71) Applicant: Micron Technology, Inc., Boise, ID (US)

(72) Inventors: Yang Lu, Boise, ID (US); Sujeet Ayyapureddi, Boise, ID (US); Edmund J. Gieske, Boise, ID (US); Cagdas Dirik, Indianola, WA (US); Ameen D. Akel, Rancho Cordova, CA (US); Elliott C. Cooper-Balis, San Jose, CA (US); Amitava Majumdar, Boise, ID (US); Robert M. Walker, Raleigh, NC (US); Danilo Caraccio, Milan (IT)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 17/946,518

(22) Filed: Sep. 16, 2022

(65) Prior Publication Data

US 2023/0393770 A1    Dec. 7, 2023

Related U.S. Application Data

(60) Provisional application No. 63/348,360, filed on Jun. 2, 2022.

(51) Int. Cl.
*G06F 3/06* (2006.01)
(52) U.S. Cl.
CPC .......... *G06F 3/0632* (2013.01); *G06F 3/0604* (2013.01); *G06F 3/0679* (2013.01)

(58) Field of Classification Search
CPC ................ G11C 7/24; G11C 11/40615; G11C 11/40622; G11C 11/4078; G11C 11/408; G11C 15/04
USPC ................................ 711/106, 108, 154, 166
See application file for complete search history.

(56) References Cited

U.S. PATENT DOCUMENTS

| | | | |
|---|---|---|---|
| 9,032,141 B2 | 5/2015 | Bains et al. | |
| 11,282,561 B2 | 3/2022 | Nale et al. | |
| 2014/0085995 A1 | 3/2014 | Greenfield et al. | |
| 2017/0117030 A1* | 4/2017 | Fisch .................. | G11C 11/4078 |
| 2023/0178140 A1* | 6/2023 | Cho .................... | G11C 11/4096 365/222 |
| 2023/0385206 A1* | 11/2023 | Agarwal ........... | G11C 11/40603 |

* cited by examiner

*Primary Examiner* — Ilwoo Park
(74) *Attorney, Agent, or Firm* — Brooks, Cameron & Huebsch, PLLC

(57) ABSTRACT

Systems, methods, and apparatus for memory device security and row hammer mitigation are described. A control mechanism may be implemented in a front-end and/or a back-end of a memory sub-system to refresh rows of the memory. A row activation command having a row address at control circuitry of a memory sub-system and incrementing a first count of a row counter corresponding to the row address stored in a content addressable memory (CAM) of the memory sub-system may be received. Control circuitry may determine whether the first count is greater than a row hammer threshold (RHT) minus a second count of a CAM decrease counter (CDC); the second count may be incremented each time the CAM is full. A refresh command to the row address may be issued when a determination is made that the first count is greater than the RHT minus the second count.

20 Claims, 5 Drawing Sheets

MEMORY DEVICE SECURITY AND ROW HAMMER MITIGATION

PRIORITY INFORMATION

This application claims the benefit of U.S. Provisional Application Ser. No. 63/348,360 filed on Jun. 2, 2022, the contents of which are incorporated herein by reference.

TECHNICAL FIELD

Embodiments of the disclosure relate generally to memory sub-systems, and more specifically, relate to memory device security and row hammer mitigation.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
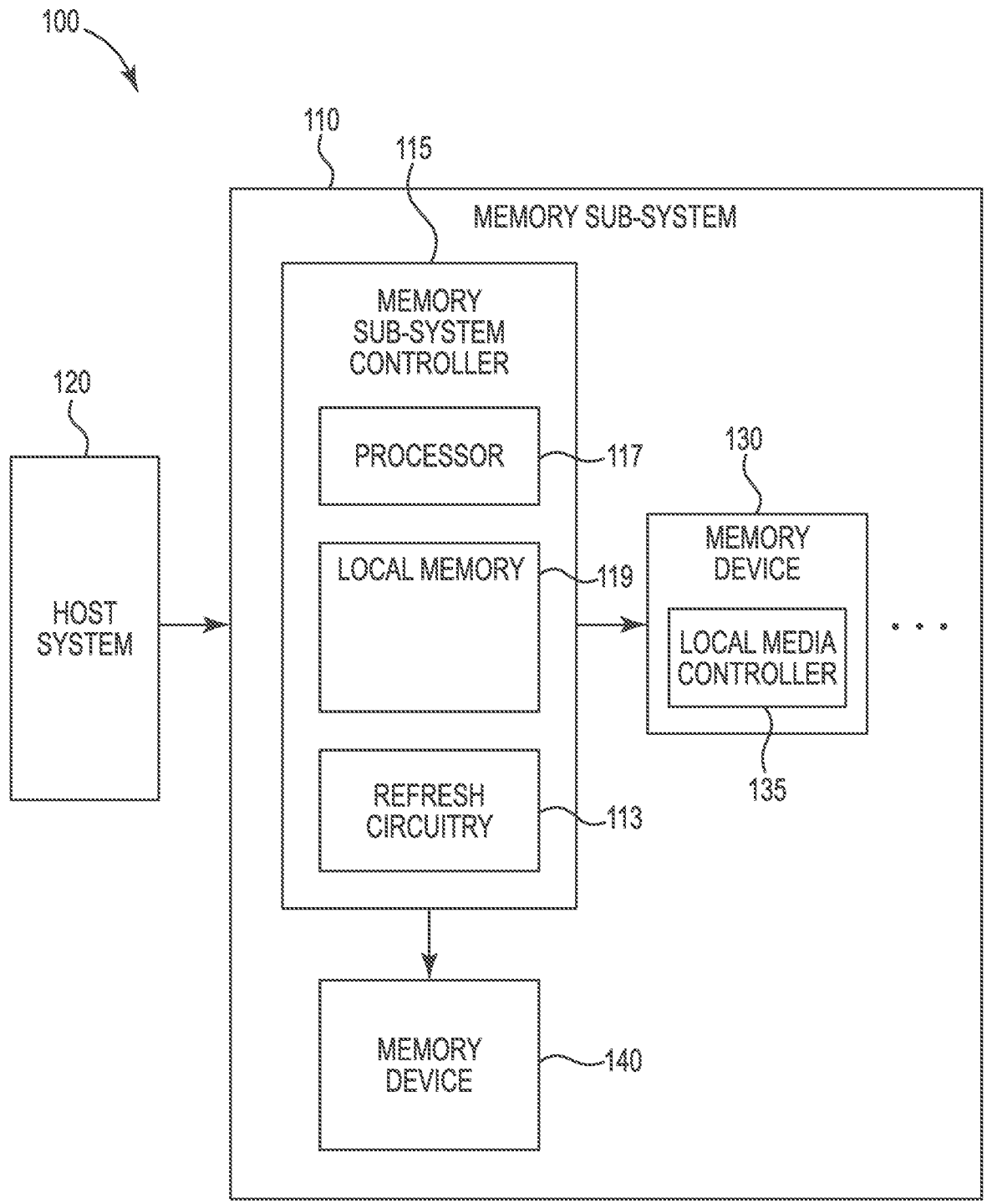
FIG. 1 illustrates an example computing system that includes a memory sub-system in accordance with some embodiments of the present disclosure.

Aspects of the present disclosure are directed to memory device security and row hammer mitigation, in particular to memory sub-systems that includes refresh circuitry. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

The front-end (e.g., front-end interface) and/or the back-end of a memory sub-system can include a row hammer mitigation mechanism to mitigate row hammer attacks. In various memory sub-systems, the front-end of the memory sub-system can be connected to a media controller which can then access a variety of media types including DRAM, 3DXP, and/or NAND, among others (e.g., emerging memories). The media controller can be referred to as the back-end of the memory sub-system As used herein, row hammer attacks access memory cells in a row of the memory array to leak the charge stored in the row of memory cells to an adjacent row of memory cells. For instance, memory cells corresponding to a particular row can be affected by a row hammer attack. Row hammer refers to undesirable changes in capacitor voltages of memory cells corresponding to a row neighboring a row being frequently accessed. A row hammer attack may be employed to intentionally alter data stored in memory by repeatedly accessing a particular row in rapid succession. The goal of a row hammer attack may be to corrupt data in an adjacent row that is not accessible.

For instance, a first row being adjacent to a second row may be accessed repeatedly over a period of time. Accessing the first row repeatedly may leak voltage from memory cells coupled to the second row to memory cells coupled to the first row. The voltage leakage may cause data corruption to data stored in the memory cells coupled to the second row. Row hammer attacks corrupt data stored in memory cells coupled to the second row by activating the memory cells coupled to the first row where the first row is adjacent to the second row. In some examples, the first row and the second row may not be adjacent but may be within a number of rows of each other.

As used herein, memory cells and/or rows can be adjacent to each other if the memory cells and/or rows are physically located next to each other in a memory array or if there is physical proximity sufficient to allow for the leakage of a charge from memory cells coupled to a row to different memory cells coupled to a different row. A row of memory cells can be next to a different row of memory cells if the addresses of the rows are consecutive and/or if there are no other rows between the adjacent rows. Memory cells may be adjacent to each other if the memory cells are coupled to rows that are adjacent to each other.

Due to various physical effects of shrinking manufacturing process geometries, the row hammer threshold (RHT) of memory sub-systems has decreased to a level at which applications running on a host of a computer system can inadvertently corrupt their own data or the data of different applications sharing the same system's memory. As used herein, the RHT is a threshold quantity of accesses of a row of memory cells after which the memory cells in the row leak a charge.

Various row hammer detector algorithms (e.g., address sampling, priority content addressable memory) may be probabilistic and thus may not guarantee perfect (e.g., complete, accurate, and/or precise) prevention of data corruption. If an aggressor knows sufficient details of these existing row hammer detection methods and their implementation mechanisms, the aggressor can attack their weaknesses to bypass or break them and corrupt data. Various row hammer detector algorithm implementations require an amount of memory and operating power that are too high to be practically useful.

Row hammer detection can include determining which addresses of a memory sub-system are accessed most frequently and refreshing the identified addresses. Determining which addresses are accessed most frequently can include storing each address that is accessed and counting which addresses are accessed most. However, storing each address that is accessed may not be feasible given memory constraints. Keeping a count for each address that is received may also not be feasible due to memory constraints specially if each address that is received is a different address. Mesa-Grise can be used to identify the most frequent items in a finite data stream. For example, the Mesa-Grise can be used to identify elements that occur more than a predefined amount of time. For example, the Mesa-Grise can be used to identify elements (e.g., addresses) that occur more than five times in a stream of addresses received from a host.

Mesa-Grise can store addresses in a dictionary. If the dictionary contains the address, then we can a count for the given address. If the dictionary does not include the address and there is space in the address, then we can add the address to the dictionary and can set a corresponding count equal to 1. If the dictionary does not include the address and there is no space in the dictionary, then the counts corresponding to addresses in the dictionary can decremented by 1 and addresses in the dictionary associated with counts that are equal to 0 can be removed from the dictionary. The Mesa-Grise can identify the most frequent elements in the stream but it can also identify less frequent elements in the stream. The Mesa-Grise may not guarantee that the identified elements are greater than a threshold which can result in false positives. False positives can include elements that don't fit the criteria but that are none the less identified. Similar to a bloom filter, the Mesa-Grise can identify false positives but not false negatives. False negatives are elements that fit a criterion but that are not identified.

Aspects of the present disclosure address the above and other deficiencies by implementing a control mechanism in a front-end and/or a back-end of a memory sub-system to refresh rows of the memory. Aspects of the present disclosure can utilize a smaller memory (e.g., SRAM) size and a smaller max false positive rate which will have no risk of "deny of services" than various previous approaches for detecting row hammer attacks. Although the examples provided herein are in the context of row hammer attacks, the examples can also be applied to the loss of data due to memory cell leakage caused by accessing the memory cells or adjacent memory cells at a greater rate than the RHT.

In various examples, the RHT and a memory decrease counter can be utilized to determine when to refresh a row of memory cells. As used herein, a memory decrease counter can be implemented in a content addressable memory (CAM) that can be referred to as associative memory. The CAM can compare input search data against a table of stored data. The CAM can return an address of matching data. However, other types of memory can be utilized to store the memory decrease counter. The memory decrease counter can also be referred to as CAM decrease counter (CDC). The CDC can be utilized to track a quantity of times a counter corresponding to a row of the memory sub-system is decreased. The CDC can be utilized to set a threshold under which rows of memory cells are refreshed which can be used to remove row counters from memory (e.g., CAM), for example. Removing row counters from memory can limit the quantity of memory that is utilized to track access commands. Limiting the quantity of memory that is utilized to track access commands can save power and memory resources. A low boundary of the false positives generated in various examples described herein can be used to determine a size of memory that is utilized to track access commands and their associated addresses. Controlling the quantity of false positives utilizing the examples described herein can be beneficial as compared to accepting the false positives generated using the Mesa-Grise given that the quantity of false positives generated utilizing the examples described herein can be less than the quantity of false positives generated using the Mesa-Grise.

Interfaces such as peripheral component interconnect express (PCIe), compute express link (CXL), cache coherent interconnect for accelerators (CCIX), etc. allow connecting a variety of memory devices to a host system. The combination of interfaces and memory technology improvements can allow for deploying "far memory," which can consist of system memory (e.g., memory devices) being implemented behind a front-end of a memory sub-system such as PCIe, CXL, CCIX, GenZ., etc. As used herein, the front-end of the memory sub-system can also be referred to as an interface of the memory sub-system or as a front-end of a controller of the memory sub-system. As used herein, the front-end of the memory sub-system can comprise hardware and/or firmware configured to receive data (e.g., requests and/or data) and provide the data to a back-end of the memory sub-system. The back-end of the memory sub-system can comprise hardware and/or firmware to receive the data (e.g., requests and/or data) from the front-end of the memory sub-system and can include perform the requests provided from the host on the memory devices of the memory sub-system.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, includes single level cells (SLC) which can store one bit per cell. Other types of memory cells, such as multi-level cells (MLCs), triple level cells (TLCs), quad-level cells (QLCs), and penta-level cells (PLC), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a refresh circuitry 113. Although not shown in FIG. 1 so as to not obfuscate the drawings, the refresh circuitry 113 can include various circuitry to facilitate determining when to refresh a row of the memory devices 130, 140. In some embodiments, the refresh circuitry 113 can include special purpose circuitry in the form of an ASIC, FPGA, state machine, and/or other logic circuitry that can allow the refresh circuitry 113 to orchestrate and/or perform operations to selectively refresh rows of the memory devices 130, 140 based on a RHT and/or a CDC.

In some embodiments, the memory sub-system controller 115 includes at least a portion of the refresh circuitry 113. For example, the memory sub-system controller 115 can include a processor 117 (processing device) configured to execute instructions stored in local memory 119 for performing the operations described herein. In some embodiments, the refresh circuitry 113 is part of the host system 110, an application, or an operating system.

In a non-limiting example, an apparatus (e.g., the computing system 100) can include a memory sub-system refresh circuitry 113. The refresh circuitry 113 can be resident on the memory sub-system 110. As used herein, the term "resident on" refers to something that is physically located on a particular component. For example, the refresh circuitry 113 being "resident on" the memory sub-system 110 refers to a condition in which the hardware circuitry that comprises the refresh circuitry 113 is physically located on the memory sub-system 110. The term "resident on" can be used interchangeably with other terms such as "deployed on" or "located on," herein.

The refresh circuitry 113 can subtract the CDC from the RHT to generate a threshold that can be utilized to determine whether to refresh a row of the memory devices 130, 140. For instance, the refresh circuitry 113 can track a plurality of counts corresponding to rows of the memory sub-system 130, 140. As used herein, a count describes a summation of a plurality of occurrences. For example, a count corresponding to a row can be a summation of a quantity of activation commands received by the memory sub-system controller 115 for a particular row. The refresh circuitry 113 can track a quantity of rows. For example, the refresh circuitry 113 can track, for multiple rows, a quantity of activations commands received.

Each of the row counts can be compared to the difference between the RHT and the CDC (e.g., RHT–CDC). For example, if an activation is received for a particular row and if the row count for the particular row is greater than the difference between the RHT and the CDC, then the refresh circuitry 113 can refrain from refreshing the particular row. If an activation is received for the particular row and if the row count for the particular row is less than the difference between the RHT and the CDC, then the refresh circuitry 113 can refresh the particular row and reset the row count corresponding to the particular row.

The refresh circuitry 113 can also track the quantity of times memory storing the row counts is full. For example, each time an activation command is received for a row of the memory devices 130, 140 that does not have a corresponding row count stored in the memory (e.g., CAM), the refresh circuitry 113 can decrement each of the row counts stored in the memory and increment the CDC. Row counts that are equal to 0 can be deleted from the memory (e.g., CAM) to track activation commands for rows that are not being tracked such as the particular row. The counts and/or other data corresponding to the row can comprise a structure which can be referred as a counter. The counter can be stored in the CAM (e.g., memory). The counter can be an entry in the CAM. While the CAM can comprise hardware structure, the counter can comprise a logical structure that includes the counts corresponding to rows of a different memory.

Figure 2:
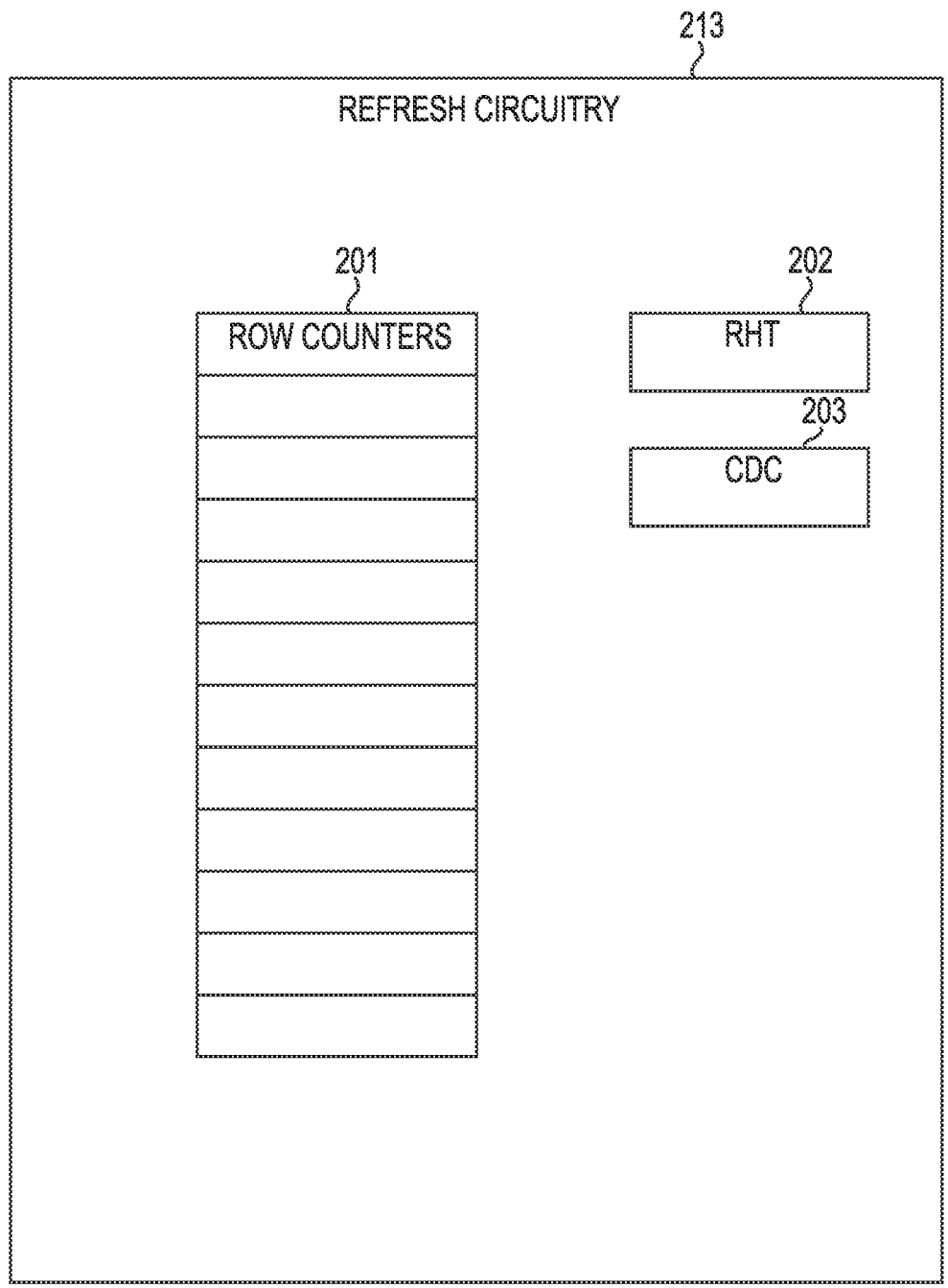
FIG. 2 is a block diagram corresponding to refresh circuitry in accordance with some embodiments of the present disclosure.

FIG. 2 is a block diagram corresponding to refresh circuitry 213 in accordance with some embodiments of the present disclosure. The refresh circuitry 213 includes the row counters 201, the RHT 202, and the CDC 203. In various examples, the row counters 201, and/or the RHT 202, the CDC 203 can be stored in memory. The memory can be, for example, the local memory 119 and/or the memory devices 130, 140 of FIG. 1. The memory that stores the row counters 201 and the CDC 203 can be a CAM, for instance. The memory that stores the RHT 202 can be registers among other possible types of memory that can be utilized to store the row counters 201, the CDC 203, and/or the RHT 202.

The RHT 202 can be static given that the RHT 202 may not change or it can be dynamic to allow for the RHT 202 to change with the life of the memory devices of the memory sub-system. The row counters 201 can be dynamic. The row counters 201 can be updated each time an activation command is received. For example, a count of a row counter stored in a CAM can be updated from a first count to a second count responsive to receipt of an activation command to a particular row. An activation command can include a read command and/or a write command, among other possible activation commands.

Figure 3:
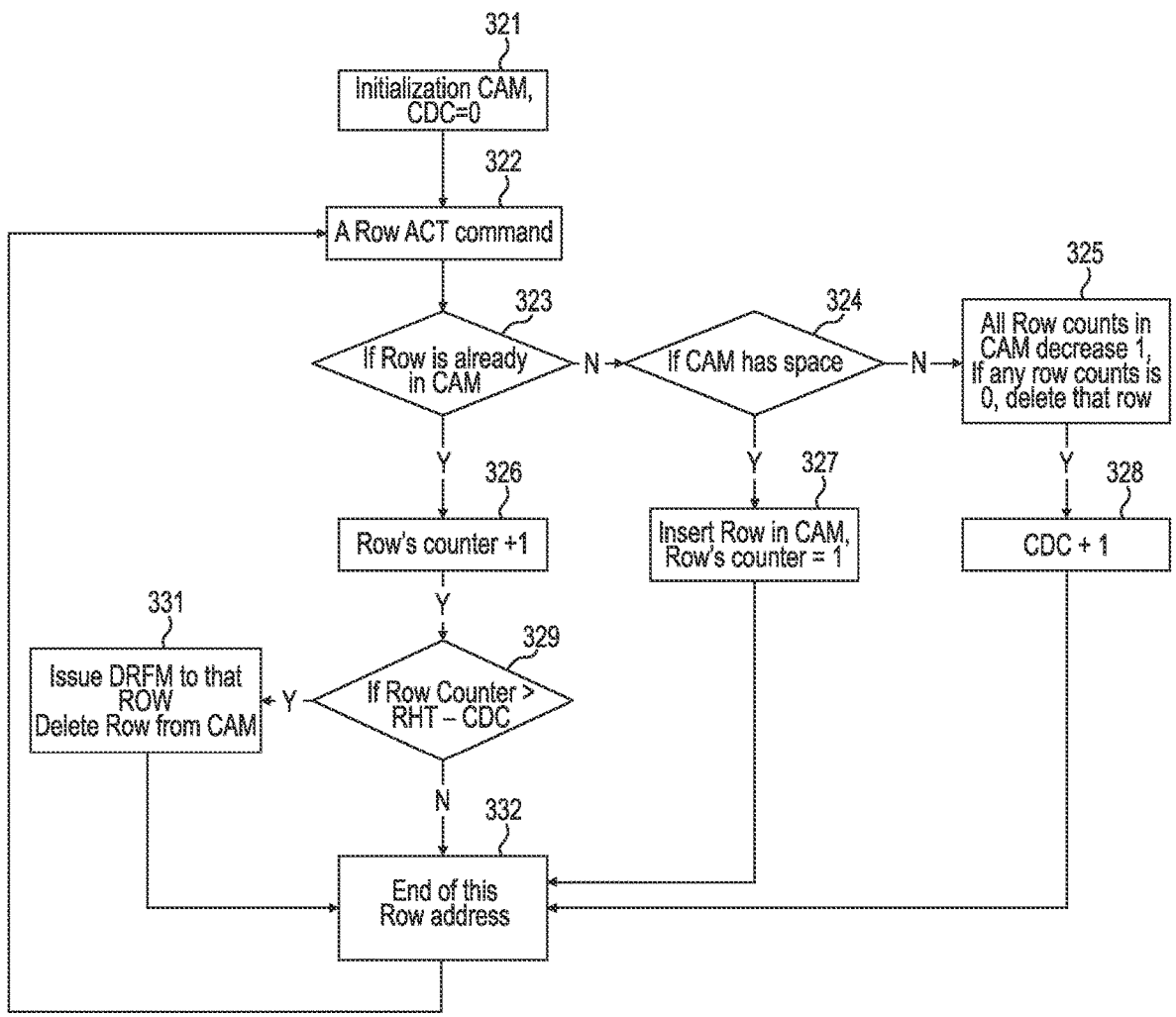
FIG. 3 is a flow diagram corresponding to refresh circuitry in accordance with some embodiments of the present disclosure.

FIG. 3 is a flow diagram corresponding to refresh circuitry in accordance with some embodiments of the present disclosure. In various instances, the refresh circuitry 113 of FIG. 1 can perform the operations corresponding to the flow diagram. At operation 321, the CAM can be initialized and the CDC can be set to 0. Initializing the CAM can include setting the size of the CAM. The size of the CAM can be set based on a frequency target and a maximum row activation during a period of time. The frequency target can be a target quantity of activation commands that can be received and processed for a row during the period of time. The frequency target can be less than the RHT which can also be expressed for a period of time and for a particular row. The maximum row activation can describe a maximum quantity of times that a particular row of a memory device can be activated for a period of time. The size of the CAM can be expressed as the maximum row activation (n) divided by the frequency target (F). In various instances, the size of the CAM can be selected in real time or can be preselected. For example, the CAM size can be selected prior to deploying the memory sub-system. The CAM size can also be selected each time the computing system is initialized, for example.

In various instances, the size of the CAM can also be set based on a desired false positive rate. For example, the size of the CAM can increase as the false positive rate decreases. The size of the CAM can also decrease as the false positive rate increases. In various instances, a desired false positive rate can be selected and the CAM size can be set based on the selected false positive rate.

At operation 322, a row activation command can be received. The row activation command can be received from a host. At operation 323, a determination can be made as to whether a row counter corresponding to a row targeted by the row activation command is stored in the CAM. Each activation command can be associated with a row of the memory devices. For example, an activation command (e.g., read command or write command, among other) can be used to access a row of the memory devices. The activation command can be received along with an address of the row targeted by the activation command. In various instances, the address of the row can be used as an identifier for the row, although different identifiers for the row can be utilized. The address of the row can be utilized to determine whether a row counter corresponding to the particular row is stored in the CAM. The CAM can be queried utilizing the address of a particular row. If a row counter corresponding to the particular row is stored in the CAM, then the CAM can return the row counter and/or a row count corresponding to the particular row. The row count can be expressed as a value that is incremented or decremented. The CAM can return a value corresponding to the row count. If a value is received from the CAM, then the flow diagram can proceed to operation 326. For example, the flow diagram can proceed to operation 326 if a determination is made that a row counter and/or a row count corresponding to a row associated with the activation command is stored in the CAM. If no value is received from the CAM (e.g., the CAM does not store a row counter and/or a row count corresponding to the row), then the flow diagram can proceed to operation 324. For example, the flow diagram can proceed to operation 324 if a determination is made that the row counter corresponding to the row associated with the activation command is not stored in the CAM (e.g., does not exist).

At operation 326, the row count can be incremented by 1. The incremented row count can correspond to a row targeted by the activation command (e.g., row activation command). The flow diagram can continue to operation 329. At operation 329, a determination can be made as to whether the value of the row count corresponding to the row targeted by the activation command is greater than the RHT minus the CDC (row count>RHT-CDC).

If the row count is not greater than the RHT minus the CDC, then the flow diagram can continue to operation 332. If the row count is greater than the RHT minus the CDC, then the flow diagram can continue to operation 331.

At operation 331, the row targeted by the activation command can be refreshed and the row counter can be deleted from the CAM. The row counter can be deleted from the CAM by deleting the value corresponding to the row count from the CAM. In various instances, the refresh circuitry 113 of FIG. 1 can refresh the corresponding row from the memory devices. For example, the refresh circuitry 113 of FIG. 1 can provide a signal to the processing device of the control circuitry of the memory sub-system to cause the row of the memory device to be refreshed. Deleting the row counter from the CAM can reduce the size of the CAM as opposed to not deleting the row counter from the CAM each time the row is refreshed. Deleting the row counter from the CAM can be different from setting the row count to 0 given that setting the row count to 0 does not reduce the size of the CAM. At operation 332, the refresh circuitry can wait to receive additional activation commands (e.g., row activation commands).

At operation 324, a determination can be made as to whether the CAM has space. For instance, a determination can be made as to whether the CAM can store an additional row counter corresponding to the row targeted by the activation command. If the CAM has space to store the additional row counter, then the flow diagram can continue to operation 327. If the CAM does not have space to store the additional row counter, then the flow diagram can continue to operation 325.

At operation 327, the row counter can be inserted in the CAM and the row count of the row counter can be initiated with a particular value such as 1. The row counter can be inserted in the CAM utilizing an identifier of the row such as the address of the row and the row count (e.g., the particular value). The flow diagram can continue to operation 332.

At operation 325, the row counts in the CAM can be decremented (e.g., decreased) by 1. The row counts that are decremented by the 1 can include a row count corresponding to the row targeted by the activation command and other row counts stored in the CAM. At operation 325, a determination can also be made as to whether any row counts have a value equal to 0. If a row count has a value equal to 0, then the corresponding row counter can be deleted from the CAM. The flow diagram can continue to operation 328.

At operation 328, the CDC is incremented by 1. Incrementing the CDC can reflect that the row counts of the CAM have been decremented by 1. The CDC can reflect a quantity of times the row counts of the CAM have been decremented by 1 in a given time period. The flow diagram can continue to operation 332.

Figure 4:
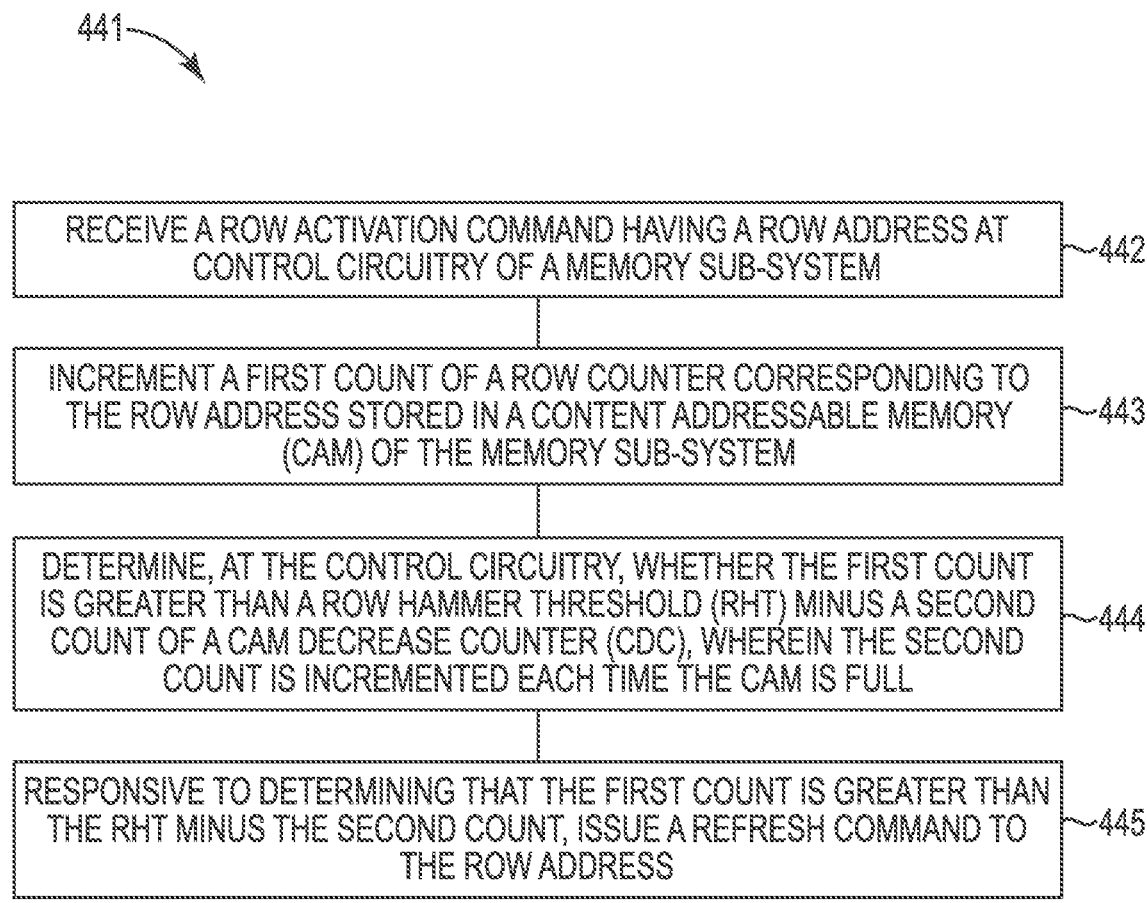
FIG. 4 is a flow diagram corresponding to a method for refreshing rows in accordance with some embodiments of the present disclosure.

FIG. 4 is a flow diagram corresponding to a method 441 for refreshing rows in accordance with some embodiments of the present disclosure. The method 441 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 441 is performed by the refresh circuitry 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, a row activation command having a row address can be received at control circuitry of a memory sub-system. Refresh circuitry of the control circuitry can receive the activation command. For example, the refresh circuitry of the control circuitry can intercept the activation command (e.g., activation commands). The row activation command can be received from a host. At operation 443, a first count of a row counter corresponding to the row address can be incremented. The first counter can be stored in content addressable memory (CAM) of the memory sub-system. The first count can be incremented by a predetermined amount. For instance, the first count of the row counter can be incremented by one or by a value greater than one.

At operation 444, a determination can be made as to whether the first count is greater than an RHT minus a second count of the CDC (e.g., RHT−CDC). The determination can be made at control circuitry of the memory sub-system. The second count of the CDC can be incremented each time the CAM is full. For example, the second count can be incremented each time the CAM is adjusted to make space for the row counter corresponding to the row address. At operation 445, responsive to determining that the first count is greater than the RHT minus the second count, a refresh command can be issued to the row address. The first count being less than RHT−the second count can indicate that there are no negative implications to processing the access command. For instance, the RHT−the second count can create a new threshold which can be used to determine whether it is safe to access memory cells having the row address. If the first count is greater than the new threshold (RHT−the second count) then the refresh circuitry can determine that it is not safe to access the memory cells having the address without refreshing the memory cells having the address prior to processing the access command. In various instances, the access command can be disregarded instead of issuing the refresh command responsive to the first counter being greater than the new threshold (RHT−the second count).

Responsive to determining that the first count is greater than the RHT minus the second count (RHT−the second count), the row counter can be deleted from the CAM. Deleting a row counter from the CAM can include making memory cells of the CAM available to store a row counter corresponding to a different address. For example, deleting the row counter corresponding to the row address from the CAM can include disassociating the row counter with a row address. Deleting the row counter can also include associating the row counter with a different row address. Deleting the row counter can also include resetting the first count of the row counter. The first count can be expressed as a value that is stored in the CAM. As such, resetting the first count can include including a default value in a portion of the row counter, that is stored in the CAM, that is associated with the row address. Incrementing the first count or decrementing the first count can include adding or subtracting from the value stored in a portion of the CAM that is associated with the row counter.

In various instances, a plurality of counts of the CDCs including the second count can be initialized to 0 prior to receipt of the row activation command. For example, the second count can be initialized to 0 prior to incrementing or decrementing counts stored in the CAM. The size of the CAM can be set based on a frequency of target for row activation commands that is less than the RHT. The size of the CAM can also be set based on the maximum quantity of row activations for a period of time. The frequency target is defined as a quantity of row activation commands expected to be received for a row address over a period of time. The size of the CAM can be set to n/F where n is the maximum row activation during the period of time. The maximum row activation can describe that maximum quantity of row activations commands that can be received for a row address over the period of time. Setting the size of the CAM to n/F can reduce the size of the CAM as compared to tracking all the row addresses of a memory device. In various examples, the frequency target can be less than the RHT such that the size of the CAM can be proportional to a value which is less than the RHT.

In various instances, a row activation command having a row address of the memory device can be received at control circuitry of a memory sub-system. Responsive to determining that a row counter corresponding to the row address is stored in the CAM, the first count of the row counter corresponding to the row address stored in the CAM can be incremented. For example, the first count can be incremented by one each time an access command having a row address is received by the memory sub-system.

A determination can be made as to whether the first count is greater than a RHT minus a second count of a CDC, where the CDC stores a quantity of times different row addresses have been unassociated with the CAM once the CAM is full. A determination can be made as to whether the row counter is stored in the CAM prior to incrementing the row counter. For example, a determination can be made as to whether a row address corresponding to the access command is associated with a portion of the CAM. If the row address is associated with a portion (e.g., a row counter) of the CAM, then a determination can be made that the row counter is stored in the CAM. If the row counter is stored in the CAM, then the first count of the row counter can be incremented.

If it is determined that the row address is not associated with any portion of the CAM, then it can be determined that the row counter corresponding to the row address is not stored in the CAM. Responsive to determining that the row counter is not stored in the CAM, a determination can be made as to whether the CAM has space to store the row counter. The CAM can have space to store the row counter if at least a portion of the CAM is not associated with any row address. Responsive to determining that the CAM has space to store the row counter (e.g., at least a portion of the CAM is not associated with any row address), the row counter associated with a row address of the access command can be stored in the CAM. The first count of the row counter can be set to 1 responsive to storing the row counter in the CAM. Responsive to setting the first count to one, the refresh circuitry of the memory sub-system can await a next row access command. Responsive to determining that the first counter is greater than the RHT minus the CDC, a refresh command can be issued to the row address after which the refresh circuitry can await a next row access command.

Responsive to determining that the CAM does not have space to store the counter, a plurality of counts of the CAM, including the first count, can be decremented. Responsive to determining that the CAM does not have space to store the row counter, delete any of the plurality of counts, and the corresponding row counters, that have a zero value to unassociated a particular row corresponding to a deleted count with the CAM. Responsive to determining that the CAM does not have space to store the row counter, the second count of the CDC can be incremented.

In various instances, a row activation command directed to a row address of the memory device can be received. The row address can correspond to a row of the memory device. A determination can be made as to whether a row counter corresponding to the row address is stored in the CAM. Responsive to determining that the row counter corresponding to the row address is stored in the CAM, a determination can be made as to whether a first count of the row counter is greater than a difference between a RHT and a second count of a CDC, wherein the CDC stores a quantity of times different row addresses have been unassociated with the CAM once the CAM is full. Responsive to determining that the first count is greater than the difference between the RHT and the second count, a refresh command can be issued to the row address.

The row counter corresponding to the row address can be deleted from the CAM responsive to determining that the first count is greater than the difference between the RHT and the second count. In various instances, the first count of the row counter can be reset rather than deleting the row counter from the CAM. The row counter can be deleted from the CAM by disassociating the row address corresponding to the row counter from a portion of the CAM or disassociating the row address corresponding to the row counter from each of the portions of the CAM.

Subsequent to determining that the row counter corresponding to the row address is not stored in the CAM, a determination can be made as to whether the CAM has space to store the row counter. Responsive to determining that the CAM does not have space to store the row counter, a plurality of counts of a plurality of row counters stored in the CAM can be decremented. For example, each of the plurality of counts stored in the CAM can be decremented by 1. Responsive to decrementing the plurality of counts, a determination can be made as to whether any of the plurality of counts is equal to 0. Responsive to determining that at least one count of the plurality of counts is equal to 0, a corresponding row counter can be deleted from the CAM. The corresponding row counters can be deleted from the CAM by disassociating a corresponding row address from any portion of the CAM. Responsive to deleting the corresponding row counter from the CAM, the CDC can be incremented. The CDC can be incremented by addition to the second value. For example, the second value of the CDC can be incremented by one or by a different set value.

Figure 5:
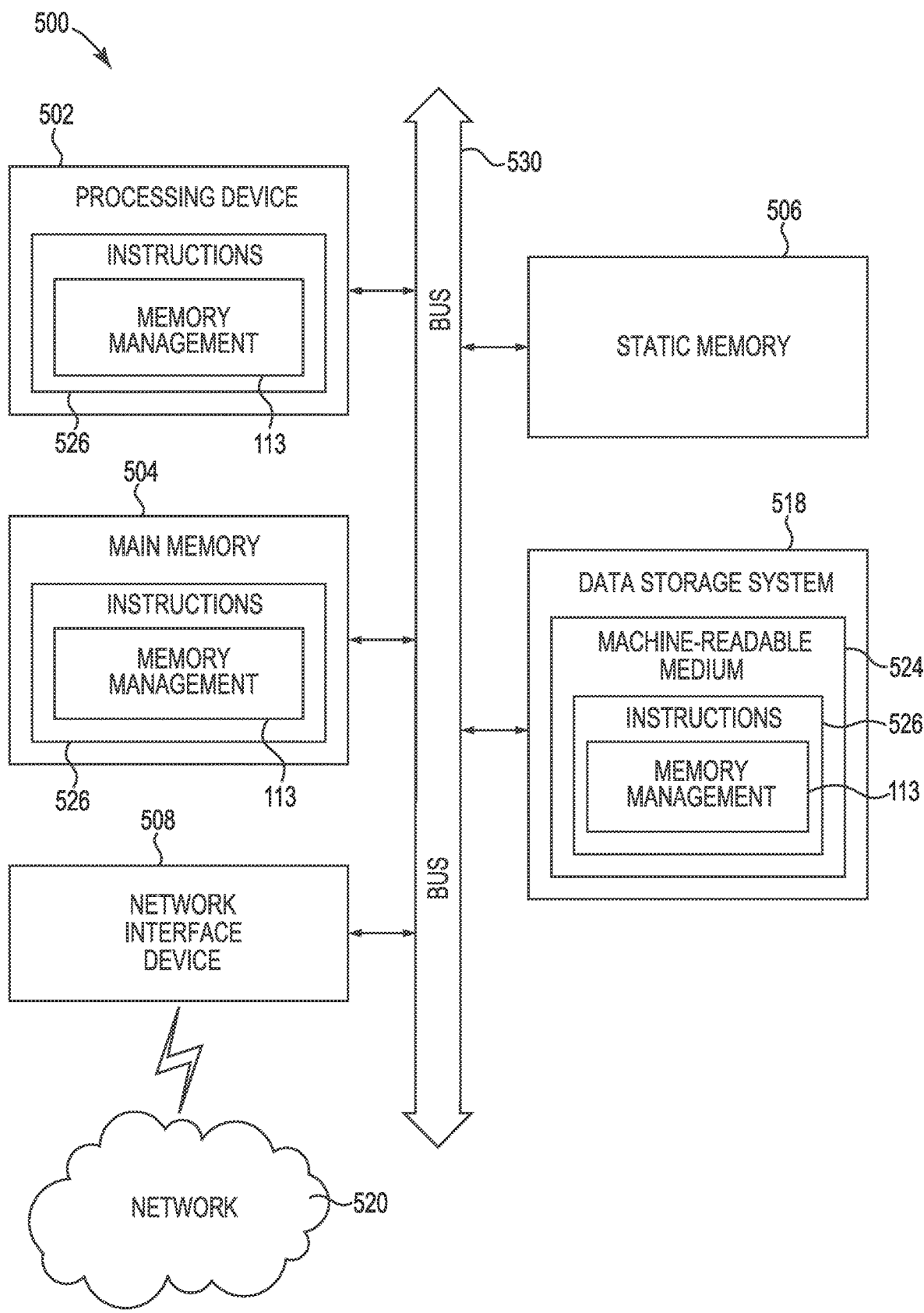
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the refresh circuitry 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a refresh circuitry (e.g., the refresh circuitry 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:
receiving a row activation command having a row address at control circuitry of a memory sub-system;
incrementing a first count of a row counter corresponding to the row address stored in a content addressable memory (CAM) of the memory sub-system;
determining, at the control circuitry, whether the first count is greater than a row hammer threshold (RHT) minus a second count of a CAM decrease counter (CDC), wherein the second count is incremented each time the CAM is full; and
responsive to determining that the first count is greater than the RHT minus the second count, issuing a refresh command to the row address.

2. The method of claim 1, further comprising, responsive to determining that the first count is greater than the RHT minus the second count, deleting the row counter corresponding to the row address from the CAM.

3. The method of claim 1, further comprising initializing a plurality of CDCs including the CDC to 0 prior to receipt of the row activation command.

4. The method of claim 1, wherein incrementing the first count of the row counter includes incrementing the first count of the row counter responsive to determining that the row counter is stored in the CAM.

5. The method of claim 1, further comprising setting a size of the CAM based on a frequency target for row activation commands.

6. The method of claim 1, further comprising setting a size of the CAM based on a frequency target for row activation commands that is less than the RHT.

7. The method of claim 1, further comprising setting a size of the CAM based on a maximum quantity of row activations for a particular period.

8. An apparatus, comprising:
a content addressable memory (CAM);
a memory device; and
control circuitry coupled to the memory device and configured to:
receive a row activation command having a row address of the memory device;
responsive to determining that a row counter corresponding to the row address is stored in the CAM, increment a first count of the row counter;
determine whether the first count is greater than a row hammer threshold (RHT) minus a second count of a CAM decrease counter (CDC), wherein the CDC stores a quantity of times different row addresses have been unassociated with the CAM once the CAM is full; and
responsive to determining that the first count is greater than the RHT minus the second count, issue a refresh command to the row address.

9. The apparatus of claim 8, wherein the control circuitry is further configured to determine whether the CAM has space to store the row counter responsive to determining that the row counter is not stored in the CAM.

10. The apparatus of claim 9, wherein the control circuitry is further configured to, responsive to determining that the CAM has space to store the row counter, store the row counter in the CAM.

11. The apparatus of claim 9, wherein the control circuitry is further configured to, responsive to determining that the CAM does not have space to store the row counter, decrement a plurality of counts of the CAM including the first count.

12. The apparatus of claim 11, wherein the control circuitry is further configured to, responsive to determining that the CAM does not have space to store the row counter, delete any of the plurality of counts that have a zero value to unassociated a particular row corresponding to a deleted count with the CAM.

13. The apparatus of claim 11, wherein the control circuitry is further configured to, responsive to determining that the CAM does not have space to store the counter, increment the second count of the CDC.

14. An apparatus, comprising:
a content addressable memory (CAM);
a memory device;
control circuitry coupled to the memory device and configured to:
receive a row activation command directed to a row address of the memory device;
determine whether a row counter corresponding to the row address is stored in the CAM;
responsive to determining that the row counter corresponding to the row address is stored in the CAM, determine whether a first count of the row counter is greater than a difference between a row hammer threshold (RHT) and a second count of a CAM decrease counter (CDC), wherein the CDC stores a quantity of times different row addresses have been unassociated with the CAM once the CAM is full; and
responsive to determining that the first count is greater than the difference between the RHT and the second count, issue a refresh command to the row address.

15. The apparatus of claim 14, wherein the control circuitry is further configured to delete the row counter corresponding to the row address from the CAM responsive to determining that the first count is greater than the difference between the RHT and the second count.

16. The apparatus of claim 14, wherein the control circuitry is further configured to, subsequent to determining that the row counter corresponding to the row address is not stored in the CAM, determine whether the CAM has space to store the row counter.

17. The apparatus of claim 16, wherein the control circuitry is further configured to, responsive to determining that the CAM does not have space to store the row counter, decrement a plurality of counts of a plurality of row counters stored in the CAM.

18. The apparatus of claim 17, wherein the control circuitry is further configured to, responsive to decrementing the plurality of counts, determine whether any of the plurality of counts is equal to 0.

19. The apparatus of claim 18, wherein the control circuitry is further configured to, responsive to determining that at least one count of the plurality of counts is equal to 0, delete a corresponding row counter from the CAM.

20. The apparatus of claim 19, wherein the control circuitry is further configured to, responsive to deleting the corresponding row counter from the CAM, increment the second count of the CDC.

* * * * *